United States Patent
Tanenbaum et al.

(10) Patent No.: US 6,773,950 B2
(45) Date of Patent: Aug. 10, 2004

(54) METHOD OF FORMING DUAL EXPOSURE GLASS LAYER STRUCTURES

(75) Inventors: David M. Tanenbaum, Claremont, CA (US); Yi-Fan Chen, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 74 days.

(21) Appl. No.: 10/156,666

(22) Filed: May 24, 2002

(65) Prior Publication Data

US 2004/0115855 A1 Jun. 17, 2004

Related U.S. Application Data

(60) Provisional application No. 60/293,624, filed on May 25, 2001.

(51) Int. Cl.[7] .............................................. H01L 21/42
(52) U.S. Cl. ........................ 438/50; 438/782; 438/795; 430/296
(58) Field of Search .......................... 438/50, 782, 795; 430/296, 320

(56) References Cited

U.S. PATENT DOCUMENTS 6,191,183 B1 * 2/2001 Kobayashi et al. ........... 522/77
6,316,153 B1 * 11/2001 Goodman et al. .............. 430/8
6,319,820 B1 * 11/2001 Liu ............................ 438/633

OTHER PUBLICATIONS

A. Imai et al., "Novel Process for Direct Delineation of Spin on Glass (SOG)," Japanese Journal of Applied Physics, vol. 29, No. 11, pp. 2653–2656, Nov. 1990.*

* cited by examiner

Primary Examiner—Carl Whitehead, Jr.
Assistant Examiner—Stephen W. Smoot
(74) Attorney, Agent, or Firm—Schwegman, Lundberg, Woessner & Kluth, P.A.

(57) ABSTRACT

Nano structures are formed in a glass layer on a substrate by defining a first structure in the glass layer using a low energy radiation exposure, and then defining a second structure in the glass layer for the dynamic layer using a higher energy radiation exposure. The structures are then developed in TMAH. The structures include at least sensors and nano-channels. Densification is performed by converting the structures to $SiO_2$. Further structures are formed by using different energy exposures. One structure is a channel having a porous wall prior to development.

33 Claims, 3 Drawing Sheets

METHOD OF FORMING DUAL EXPOSURE GLASS LAYER STRUCTURES

RELATED APPLICATION

This application claims priority to U.S. Provisional Patent Application Serial No. 60/293,624, filed May 25, 2001, the entirety of which is hereby incorporated by reference.

The present invention was made with Government support under Grant No. DMR-9632275 awarded by the National Science Foundation. The Government has certain rights in the invention.

FIELD OF THE INVENTION

The present invention relates to nano-scale mechanical systems, and in particular to the fabrication of suspended structures

BACKGROUND OF THE INVENTION

Nanoscale mechanical systems have potential to be very high Q oscillators for use in biological and chemical sensor applications. Such systems also may be used in ultra fast optical switching and signal processing systems. Many materials have been used to fabricate these types of systems. Typical fabrication requires a specialized substrate with two distinct layers. An upper layer becomes a freely suspended dynamic structure, and the lower layer is a sacrificial layer that is used to undercut the suspended layer while still supporting it at large fixed points. A lithographic pattern is transferred into the upper layer by an anisotropic etch and released by an isotropic etch of the exposed sacrificial layer. This requires a geometry of the supporting layer to have features significantly larger than the dynamic structure. Such a larger geometry of the supporting layer may not be desired for certain applications. Larger geometries can require longer process times to undercut oxides and more precise timing of process steps to ensure reproducibility at edges of structures. Further, larger geometries require more chip real estate, resulting in lower density of structures on a chip.

SUMMARY OF THE INVENTION

Nano structures are formed in a glass layer on a substrate by defining a first structure in the glass layer using a low energy radiation exposure, and then defining a second structure in the glass layer for the dynamic layer using a higher energy radiation exposure. The structures are then developed in TMAH. The structures include at least sensors and nano-channels. Densification is performed by converting the structures to $SiO_2$. Further structures are formed by using different energy exposures.

In one embodiment, the glass layer is formed of spin on glass (SOG). The exposures are done in any order, due to the single development of both structures. A low energy exposure has a very short penetration depth, and is used to define a dynamic structure for an oscillator in one embodiment. A higher energy exposure penetrates through the glass layer, resulting in a support structure for the dynamic layer. Further exposures a different energy levels may be used to create more complex three-dimensional structures beyond simple oscillators.

In a further embodiment, developed structures are transferred through an ethanol bath to a critical point CO2 dryer to prevent collapse due to surface tension. The structures are then densified in one embodiment to convert them to an amorphous glass structure. In yet a further embodiment, hydrogen silsesquioxane (HSQ) is exposed by the electron beam exposures, and is then converted to $SiO_2$ by one of many different methods.

In one embodiment, a channel is formed using the two-exposure process. A high-energy exposure is used to pattern one or more walls having a series of short segments with gaps between the segments. An alternative is to use pillar array or lines of pillars for the sidewalls. The second exposure, a lower energy exposure is used to form a thin suspended layer that extends beyond the sidewall or sidewalls. When the exposed structures are developed, the thin suspended layer collapses down over the gaps, forming a self-sealed channel.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1A:
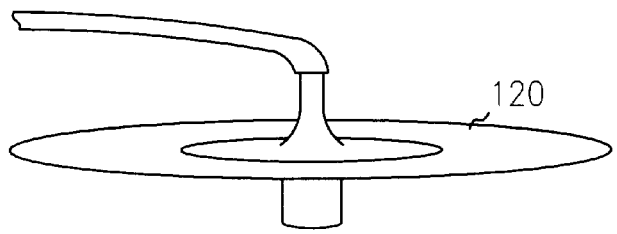
FIGS. 1A, 1B, and 1C are a representation of a dual energy electron beam exposure process.
Figure 1B:
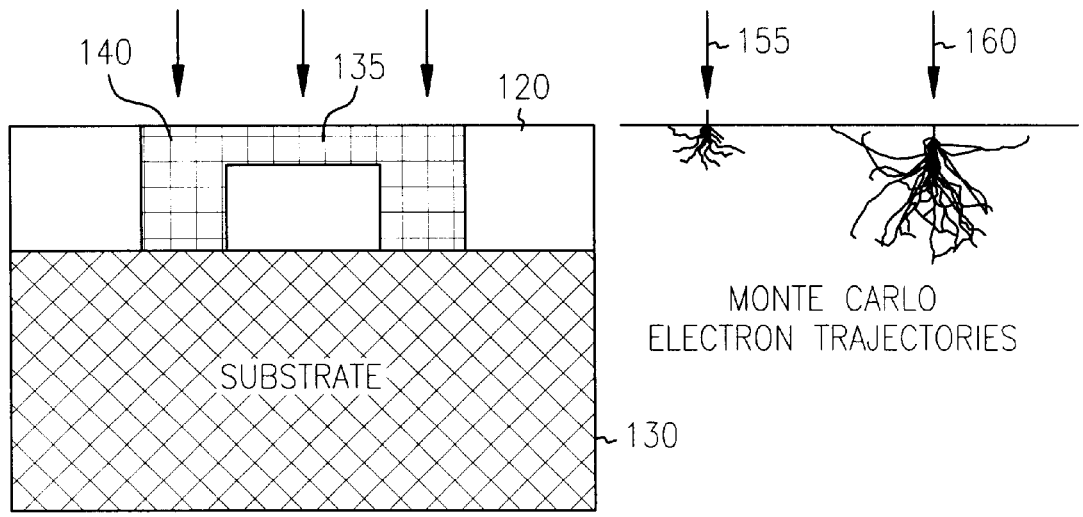
Figure 1C:
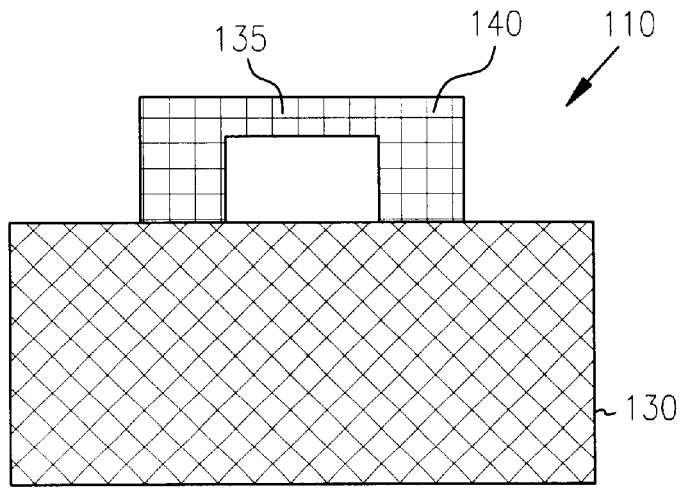

A process for forming nanomechanical devices 110 in FIGS. 1A, 1B and 1C uses a single layer of spin on glass (SOG) material 120 supported by a substrate 130 with two patterned negative tone exposures 135, 140 at two different exposure energies to define dynamic and support structures 135 and 140 respectively as shown in FIG. 1C. A low energy exposure has a very short penetration depth, similar to a top surface imaging process. The low energy exposure defines the dynamic layer 135, which in the case of an oscillator has desired degrees of freedom for motion. A second exposure is performed with a higher energy penetrates through the entire glass layer thickness, resulting in a support structure 140 for the dynamic layer 135. There is no processing required between the exposures, so the order of the exposures does not matter.

SOG 120 is formed in a known manner by applying a coating to a substrate using an SOG spin coater, followed by melt and flow on spin-coater hot plates. The coating is converted in a quartz tube furnace in one embodiment. Many spin on glasses are alternatively used, however those with well known properties, and those that are easily converted to $SiO_2$ are convenient. In further embodiments, dopants are used to provide color for providing better optical interferometry signals. Optical differences, such as the characteristic of higher reflectivity make for easier measurements. In one embodiment, the desired properties of the glass are that it has high resolution for lithography. It also has a well-understood chemistry and proven ability to cross link under electron bombardment.

Both patterns are developed simultaneously to remove the unexposed material, including the unexposed material beneath the dynamic layer 135, releasing the structure. Devices are the cleaned, such as by transferring them through an ethanol bath, and then are subjected to a critical point $CO_2$ dryer to prevent collapse due to surface tension. After development the three-dimensional cross-linked SOG structures are densified in one embodiment, converting them to an amorphous glass structure. Amorphous glass structures can make very high Q resonators, and should be appropriate for developing high sensitivity sensors. In such an oscillator, dynamic structure 135 extends some distance between support clamps represented by 140. The frequency of the oscillator is dependent on the Young's modulus, tension, density and length of the dynamic structure. Rigid steel beams have a frequency of oscillation which is close to inversely proportional to the square of the length of the dynamic structure, while a rope pulled tight would be closer to inversely proportional to the length.

In one embodiment, the dual exposure process uses low energy electron beam exposures of Hydrogen Silsesquioxane (HSQ). HSQ has high resolution and sensitivity in negative-tone electron beam lithography. Variable energy electron beam lithography allows control of the electron penetration depth over three orders of magnitude, from 10 nm to 10 $\mu$m with a single exposure tool (LEO 982 SEM with NPGS pattern generator). In one embodiment, 200 nm-thick HSQ films are exposed to 1 keV electrons 155 to define suspended structures, and 3 keV electrons 160 to define support structures. The 1 keV exposures 155 produce suspended structures 135 which are 40 nm-thick with a lateral dimensions as small as 150 nm. The 3 keV exposures 160 produce 200 nm-tall support structures 140 with lateral dimensions as small as approximately 200 nm. Monte Carlo electron trajectories are also shown in FIG. 1B corresponding to the low and high power electron beams 155 and 160.

Exposures of up to 100 keV or more provide very narrow features if desired due to less lateral scattering near the surface. Similarly, low energy exposures are varied between 1 and 3 keV in one embodiment to form the suspended structures. The energies may be varied depending on the characteristics of the structure desired and the thickness of the glass.

The HSQ structures can be converted to $SiO_2$ or amorphous glass structures using any of three methods, a rapid thermal anneal in an oxygen ambient at approximately 1000° C., an exposure in an oxygen plasma, or a UV ozone exposure. In one embodiment, dense glass or fused quartz is used. Temperatures may vary, such as approximately 400° C. or other temperatures may also be used.

In an alternative embodiment, the dual exposure method is performed using photolithography if the wavelengths of the exposing photons are chosen carefully. HSQ is combined with photobase generators to allow negative tone DUV lithography. The dual exposure process eliminates the need to do reactive ion etching in one embodiment, and can be performed on any planar substrate, even above existing integrated circuits, since both the dynamic and supporting structures are fabricated from the same SOG. The only chemical exposure is to a developer, TMAH, in contrast to HF used in many processes. Other developers may also be used as desired. Finally, this process allows the support structure to have an arbitrary size scale independent of the dynamic structures.

Figure 2:
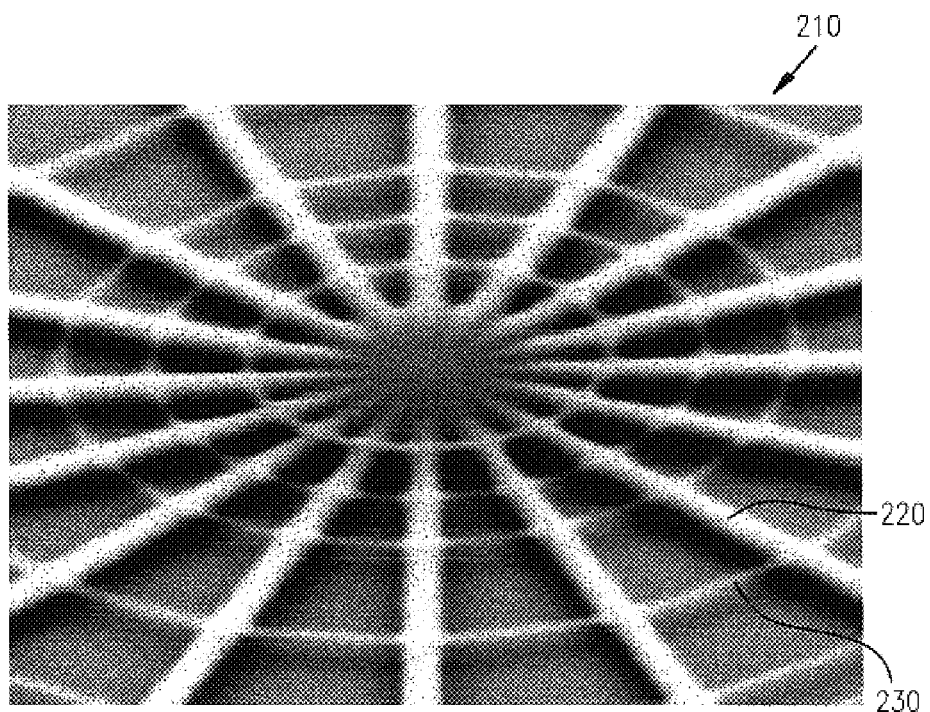
FIG. 2 is a perspective view of one structure formed using the method of the present invention.

In FIG. 2, a glass web is shown at 210. The web consists of a 200 nm-high radial support structure consisting of multiple spoke supports 220. Rings 230 are supported from the spoke supports 220, and are approximately 40 nm-thick. This is just one example of the complexity of the structures that can be formed utilizing the present dual exposure process. Many other nanomechanical and microfluidic systems may be formed. The two exposures may be used to define channel ceilings and channel walls to form fluid carrying structures. Further, irrigation holes may be provided, or the structures supported by underneath by pillar arrays to enhance structural rigidity.

Figure 3:
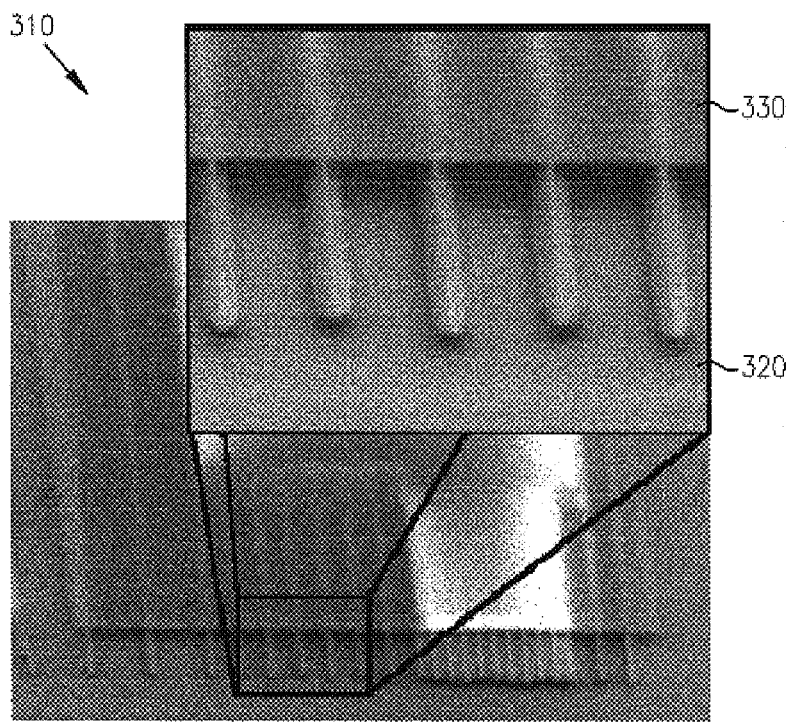
FIG. 3 is a perspective view of parallel glass capillaries formed using the method of the present invention.

An edge of a set of parallel glass capillaries are shown in a magnified view at 310 in FIG. 3. The capillaries are formed using the multi-exposure process described herein, and are supported on a silicon substrate 320. The capillaries are approximately 150 um long, 1 um high, and have a width of approximately 5 um. A capillary roof 330 is suspended above the channel.

Figure 4:
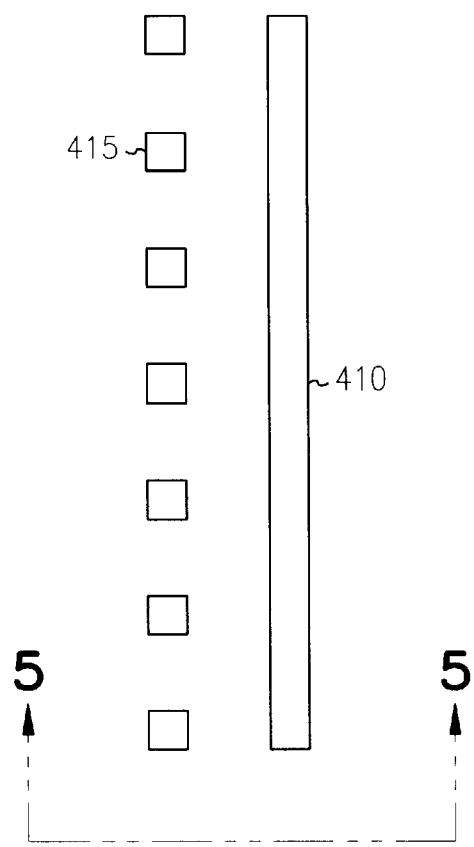
FIG. 4 is a planar view of walls for a channel wherein one of the walls is porous.

A further embodiment of a method of forming a microchannel is shown in planar view in FIG. 4. Two walls are patterned. A first wall 410 is a standard solid wall serving as one side of the microchannel. It is shown as straight, but may be curved or formed in any other shape as desired. A second wall 415 is a porous sidewall having irrigation holes. It is formed of pillars in one embodiment. The pillars are about 0.25 um on a side, and are spaced about 1 um apart. They are spaced from the first wall 410 an amount corresponding to the desired channel width. In further embodiments, the pillars are in the form of a broken wall such as short segments with gaps having varying dimensions, but provide openings for the developer to penetrate into the channel. A uniform set of openings provides fairly equal development time, independent of the length of the channel or other structure. The spacing and size of the gaps influences the penetration depth required for the developer to reach undeveloped areas, and may vary greatly.

Figure 5:
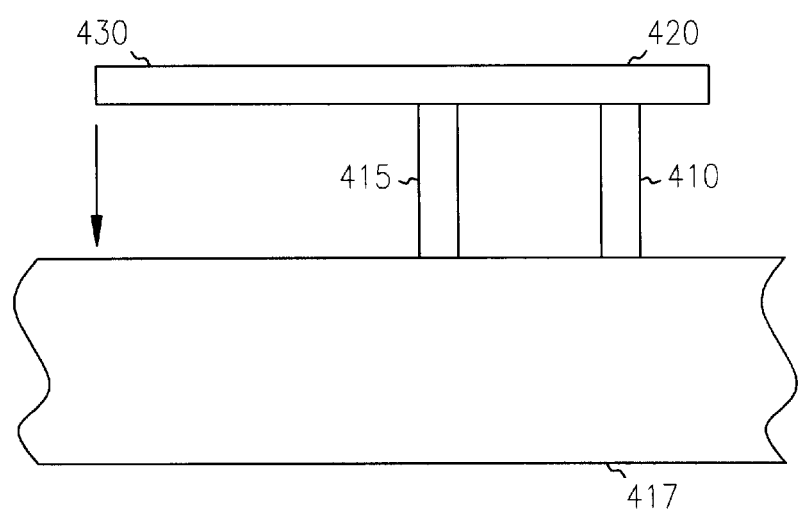
FIG. 5 is a side view of the walls for a channel in FIG. 4 with a cover that collapses over the porous wall.

FIG. 5 is a cross section of the channel of FIG. 4. Walls 410 and 415 are formed on a substrate 417, and include a suspended layer or roof 420. Roof 420 is formed with overhangs, which overhang the walls. Roof 420 overhangs porous wall 415 as indicated at 430 an amount sufficient to provide self-sealing of the porous wall 415 during processing. In one embodiment, roof 420 is flexible. The thickness of the roof is approximately 100 nm. The layer simply collapses down, approximately 1 nm in one embodiment, onto the substrate 417 after removal from the developer. In one embodiment, the roof 420 is extends beyond wall 415 to form a sealing region of about 5–10 ums. Critical point drying is no longer required in this embodiment, however, sealing may be enhanced by further processing steps, such as during densification.

CONCLUSION

While the invention is described with reference to dual exposure embodiments, and the creation of dynamic or suspended structures, it is apparent from the detailed description that multiple exposures at different power levels may be utilized to create much more complex structures, with or without suspended portions. Such further structures include intricate structures formed within channels, such as valves, separation structures and flow sensors. The claims should not be limited to just two exposures, nor the order in which the exposures and developing occurs.

In further embodiments, one or more, shallow exposures can be used to form structures. If the exposures do not reach the substrate, the structures float off during development, providing stand-alone structures not attached to the substrate. The sizes and shapes of such structures is very diverse.

In still further embodiments, the HSQ film thickness is varied between approximately 200 nm to 1.2 um, and the electron beam penetration depth varies from 10 nm to 1.2 um. Similarly, parameters associated with the porous wall and corresponding roof may be significantly varied without departing from the scope of the invention. The parameters are not thought to be limits, and as basic technologies utilized in the process improve, greater ranges are expected for all parameters described herein.

In yet further embodiments, other methods of defining structures utilize photons, ions and photolithographic processes where depth is controlled by energy of the particles used to define the structures by cross linking.

What is claimed is:

1. A method of forming nano structures, the method comprising:

defining a dynamic layer in a glass layer of a substrate using low energy electron beam exposure; and defining a support structure in the glass layer for the dynamic layer using a higher energy electron beam exposure.

2. The method of claim 1 wherein the glass layer is a single layer of spin on glass (SOG).

3. The method of claim 1 wherein the electron beam exposures are negative tone exposures.

4. The method of claim 1 and further including developing to remove all material not exposed to the electron beam exposures.

5. A method of forming nano-structures, the method comprising:

forming a single glass layer on a substrate;

performing a low energy electron beam exposure to form a first structure in the single glass layer; and performing a higher energy electron beam exposure to form a second structure underneath the first structure in the single glass layer.

6. The method of claim 5 and further comprising simultaneously developing the structures.

7. The method of claim 6 wherein the structures are developed in TMAH.

8. The method of claim 5 wherein the structures are developed and transferred through an ethanol bath to a dryer.

9. The method of claim 5 wherein the structures are densified.

10. The method of claim 9 wherein densification is performed by converting the structures to $SiO_2$.

11. The method of claim 5 wherein the energy of the low energy electron beam is approximately 1 to 3 keV.

12. The method of claim 11 wherein the energy of the high energy electron beam is approximately 3 to 100 keV.

13. The method of claim 5 and further comprising forming a third structure beneath the first two structures using yet a higher energy electron beam.

14. The method of claim 5 wherein the structures form a channel with walls.

15. The method of claim 5 wherein the structures form a device selected from the group consisting of pillars, flow sensors, single tubes and valves.

16. A method of forming nano structures, the method comprising:

defining a dynamic layer in a glass layer of a substrate using low energy electron beam exposure;

defining a support layer in the glass layer for the dynamic layer using a higher energy electron beam exposure;

developing the layers to form a nano structure;

cleaning the nano structure;

drying the nano structure; and densifying the nano structure.

17. A method of forming nano structures, the method comprising:

forming a spin on glass layer on a substrate;

defining a dynamic layer in the glass layer using low energy electron beam exposure;

defining a support layer in the glass layer for the dynamic layer using a higher energy electron beam exposure;

developing the layers in TMAH to form a nano structure;

cleaning the nano structure in ethanol;

drying the nano structure using a critical point $CO_2$ drying process; and densifying the nano structure into $SiO_2$.

18. The method of claim 17 wherein the energy of the low energy electron beam is approximately 1 to 3 keV.

19. The method of claim 17 wherein the energy of the high energy electron beam is approximately 3 to 100 keV.

20. A method of forming nano structures, the method comprising:

defining a dynamic layer in a glass layer of a substrate using low wavelength photon exposure; and defining a support structure in the glass layer for the dynamic layer using a higher energy photon exposure.

21. The method of claim 20 wherein the glass layer is a single layer of spin on glass (SOG).

22. The method of claim 21 wherein the radiation exposures are negative tone exposures.

23. The method of claim 20 and further including developing to remove all material not exposed to the radiation.

24. A method of forming nano structures, the method comprising:

defining a dynamic layer in a glass layer on a substrate using low energy electron beam exposure that does not extend to the substrate;

developing the layers to form a nano structure; and densifying the nano structure.

25. A method of forming a channel, the method comprising:

forming a spin on glass layer on a substrate;

defining a first and second wall for the channel in the glass layer using high energy radiation exposure, wherein the first wall is porous;

defining a roof in the glass layer coupled to the first and second walls using a lower energy radiation exposure, wherein the roof extends over the first wall; and developing the roof and walls in a developer such that the roof extending over the first wall seals the first wall.

26. The method of claim 25 where the glass layer comprises $SiO_2$, and further comprising densifying the $SiO_2$ forming the channel.

27. The method of claim 25 wherein the roof extends 5–10 um beyond the first wall.

28. The method of claim 25 wherein the first wall comprises a line of spaced pillars.

29. The method of claim 28 wherein the pillars are approximately 0.25 um wide and spaced approximately 1 um.

30. The method of claim 25 wherein the roof is flexible.

31. The method of claim 30 wherein the roof is approximately 100 nm thick.

32. A method of forming nano structures, the method comprising:

defining a support structure in a glass layer beneath an existing structure of a dynamic layer in the glass layer using an electron beam exposure.

33. A method of forming nano-structures, the method comprising:

forming a single glass layer on a substrate;

forming a first structure in the single glass layer; and performing a radiation exposure to form a second structure underneath the first structure in the single glass layer.

* * * * *